(12) United States Patent
Yokouchi et al.

(10) Patent No.: US 8,161,636 B2
(45) Date of Patent: *Apr. 24, 2012

(54) CIRCUIT BOARD AND METHOD OF MANUFACTURING THE SAME

(75) Inventors: Kishio Yokouchi, Kawasaki (JP); Hideaki Yoshimura, Kawasaki (JP); Katsuya Fukase, Nagano (JP)

(73) Assignees: Fujitsu Limited, Kawasaki (JP); Shinko Electric Industries Co., Ltd., Nagano-shi (JP)

( * ) Notice: Subject to any disclaimer, the term of this patent is extended or adjusted under 35 U.S.C. 154(b) by 567 days.

This patent is subject to a terminal disclaimer.

(21) Appl. No.: 12/272,048

(22) Filed: Nov. 17, 2008

(65) Prior Publication Data

US 2009/0095521 A1   Apr. 16, 2009

(30) Foreign Application Priority Data

Oct. 12, 2007  (JP) .................................. 2007-265990

(51) Int. Cl.
*H01K 3/10* (2006.01)
(52) U.S. Cl. ................ 29/852; 29/830; 29/831; 29/832; 29/846; 29/847
(58) Field of Classification Search .................... 29/852, 29/830, 831, 832, 846, 847; 428/549, 567, 428/608, 611, 209; 438/27, 65; 257/98, 257/116; 174/110 D, 266, 68.5, 256

See application file for complete search history.

(56) References Cited

U.S. PATENT DOCUMENTS

| | | | |
|---|---|---|---|
| 4,591,659 A * | 5/1986 | Leibowitz | ..................... 174/256 |
| 6,869,664 B2 | 3/2005 | Vasoya et al. | |
| 7,038,142 B2 | 5/2006 | Abe | |
| 7,224,046 B2 | 5/2007 | Abe et al. | |
| 2003/0085058 A1* | 5/2003 | Komatsu et al. | ............... 174/264 |
| 2003/0136577 A1 | 7/2003 | Abe | |

(Continued)

FOREIGN PATENT DOCUMENTS

JP          2002-013040 A       1/2002

(Continued)

OTHER PUBLICATIONS

Korean Office Action dated Sep. 28, 2010, issued in corresponding Korean Patent Application No. 10-2008-0114308.

(Continued)

*Primary Examiner* — Derris Banks
*Assistant Examiner* — Tai Nguyen
(74) *Attorney, Agent, or Firm* — Westerman, Hattori, Daniels & Adrian, LLP

(57) ABSTRACT

A circuit board has plated through holes which are laid out with a fine pitch and meets requirements relating to characteristics such as the thermal expansion coefficient of the circuit board. A method of manufacturing a circuit board includes: a step of forming a core portion by thermal compression bonding prepregs which include first fibers that conduct electricity and second fibers that do not conduct electricity, which have the second fibers disposed at positions where plated through holes will pass through, and which are impregnated with resin; a step of forming through holes at positions in the core portion where the second fibers are disposed; and a step of forming a conductive layer on inner surfaces of the through holes to form plated through holes at positions that do not interfere with the first fibers and thereby produce a core substrate.

5 Claims, 4 Drawing Sheets

U.S. PATENT DOCUMENTS

| | | |
|---|---|---|
| 2005/0218503 A1 | 10/2005 | Abe et al. |
| 2006/0244134 A1 | 11/2006 | Inagaki et al. |
| 2007/0256858 A1 | 11/2007 | Kariya et al. |
| 2007/0281394 A1 | 12/2007 | Kawabe et al. |
| 2008/0083560 A1 | 4/2008 | Saiki et al. |

FOREIGN PATENT DOCUMENTS

| | | |
|---|---|---|
| JP | 2002-192523 A | 7/2002 |
| JP | 2003-218287 A | 7/2003 |
| JP | 2004-515610 A | 5/2004 |
| JP | 2005-187301 A | 7/2005 |
| JP | 2006-332647 A | 12/2006 |
| JP | 2007-288055 A | 11/2007 |
| JP | 2008-053362 A | 3/2008 |
| JP | 2008-85106 A | 4/2008 |
| WO | 00-18202 A1 | 3/2000 |
| WO | 02/47899 A1 | 6/2002 |
| WO | 2004/064467 A1 | 7/2004 |

OTHER PUBLICATIONS

Korean Office Action dated May 12, 2011, issued in corresponding Korean Patent Application No. 10-2008-0114308.

Notice of Rejection dated Dec. 13, 2011, issued in corresponding Japanese Patent Application No. 2007-265990.

* cited by examiner

CIRCUIT BOARD AND METHOD OF MANUFACTURING THE SAME

BACKGROUND OF THE INVENTION

1. Field of the Invention

The present invention relates to a circuit board and a method of manufacturing the same, and in more detail to a circuit board with a core substrate, a method of manufacturing the same, a semiconductor device that uses a circuit board, and a prepreg used in a circuit board.

2. Related Art

Circuit boards used to mount semiconductor elements include boards with a core substrate made of carbon fiber reinforced plastic (CFRP). A core substrate made of CFRP has a low thermal expansion coefficient compared to a conventional core substrate made of a glass epoxy substrate. A circuit board that uses a CFRP core substrate can be manufactured so that the thermal expansion coefficient matches the thermal expansion coefficient of a semiconductor element, which is effective in avoiding thermal stress that is produced between the semiconductor element and the circuit board.

A circuit board is formed by laminating wiring layers on both surfaces of the core substrate and forming PTH (Plated Through Holes) to conduct electricity between the wiring layers laminated on both surfaces of the core substrate. These PTH are formed by forming through holes in the substrate and then carrying out plating to form conductive parts (a plated layer) on the inner wall surfaces of the through holes.

However, for a core substrate with a core portion of a material like CFRP that conducts electricity, if through holes are simply formed in the substrate and the inner wall surfaces of such through holes are plated, electrical shorting will occur between the PTH and the core portion. For this reason, when forming PTH in a core substrate with a core portion that conducts electricity, preliminary holes are formed through the core substrate with a larger diameter than the PTH, the preliminary holes are filled with an insulating resin, and then the PTH are formed inside the preliminary holes to prevent shorting between the PTH and the core portion (see Patent Documents 1, 2).

Patent Document 1
 Japanese Laid-Open Patent Publication No. 2003-218287
Patent Document 2
 Japanese Domestic Republication No. 2004/064467

SUMMARY OF THE INVENTION

However, with a layout where preliminary holes are formed in the core substrate and the PTH are formed so as to pass through the preliminary holes, since the preliminary holes have a larger diameter than the PTH, compared to a construction where PTH are simply formed in the core substrate, there is an increase in the layout spacing between the PTH, which limits the density with which the PTH can be formed.

Also, if the preliminary holes are filled with an insulating resin, there is an effect whereby the thermal expansion coefficient of the core substrate is increased, and for a circuit board equipped with a core portion made of carbon fibers, this reduces the advantage of having the core substrate formed with a low thermal expansion coefficient.

The present invention was conceived to solve the problems described above and it is an object of the present invention to provide a circuit board where the plated through holes formed in the circuit board can be laid out with a fine pitch and where the core substrate can meet requirements relating to strength and the thermal expansion coefficient, a method of manufacturing the same, a semiconductor device, and a prepreg used in a circuit board.

To achieve the stated object, a method of manufacturing a circuit board according to the present invention includes: a step of forming a core portion by thermal compression bonding prepregs which include first fibers that conduct electricity and second fibers that do not conduct electricity, which have the second fibers disposed at positions where plated through holes will pass through, and which are impregnated with resin; a step of forming through holes at positions in the core portion where the second fibers are disposed; and a step of forming a conductive layer on inner surfaces of the through holes to form plated through holes at positions that do not interfere with the first fibers and thereby produce a core substrate.

In the step of forming the core portion, a plurality of prepregs may be subjected to thermal compression bonding with positions where the second fibers are disposed and where the plated through holes will pass through aligned relative to one another.

A circuit board according to the present invention includes: a core substrate; wiring layers provided so as to be laminated on both surfaces of the core substrate; and plated through holes that are provided in the core substrate and electrically connect the wiring layers, wherein a core portion that constructs the core substrate is formed by thermal compression bonding prepregs which include first fibers that conduct electricity and second fibers that do not conduct electricity, which have the second fibers disposed at positions where the plated through holes will pass through, and which are impregnated with resin, and the plated through holes are provided so as to not interfere with the first fibers. It is also possible to use such circuit board as an interposer.

Here, carbon fibers can be favorably used as the first fibers and aramid fibers can be favorably used as the second fibers.

A semiconductor device according to the present invention includes: a circuit board; and a semiconductor element that is mounted directly on the circuit board or mounted with the circuit board as an interposer, wherein the circuit board includes: a core substrate; wiring layers provided so as to be laminated on both surfaces of the core substrate; and plated through holes that are provided in the core substrate and electrically connect the wiring layers, wherein a core portion that constructs the core substrate is formed by thermal compression bonding prepregs which include first fibers that conduct electricity and second fibers that do not conduct electricity, which have the second fibers disposed at positions where the plated through holes will pass through, and which are impregnated with resin, and the plated through holes are provided so as to not interfere with the first fibers.

A prepreg according to the present invention is used to form a core substrate or an insulating layer of a circuit board and includes: first fibers that conduct electricity; and second fibers that do not conduct electricity, wherein the prepreg is impregnated with resin.

By disposing the second fibers at positions where the PTH will pass through, when the PTH are provided, it is possible to avoid electrical shorting between the PTH and the first fibers that conduct electricity.

Here, carbon fibers can be favorably used as the first fibers and aramid fibers can be favorably used as the second fibers.

With the circuit board and method of manufacturing a circuit board according to the present invention, by constructing the prepregs that form the core portion of a core substrate so as to include first fibers that conduct electricity and second fibers that do not conduct electricity and so that the nonconductive second fibers are disposed at positions where plated through holes will pass through, it is possible to dispose the PTH so as to avoid electrical shorting with the first fibers. By doing so, it is possible to dispose the PTH with a fine pitch and to simplify the construction and the manufacturing process of a circuit board. Also, by appropriately combining the first fibers and the second fibers, it is possible to improve the characteristics of a circuit board.

DESCRIPTION OF THE PREFERRED EMBODIMENTS

Method of Manufacturing a Circuit Board

One embodiment of a method of manufacturing a circuit board according to the present invention will now be described.

In the method of manufacturing a circuit board according to the present embodiment, a core substrate with a core portion made of carbon fiber reinforced plastic (CFRP) is used.

FIGS. 1A to 1F show the manufacturing steps up to the formation of a core substrate 20 with a core portion 10 made of CFRP.

Figure 1:
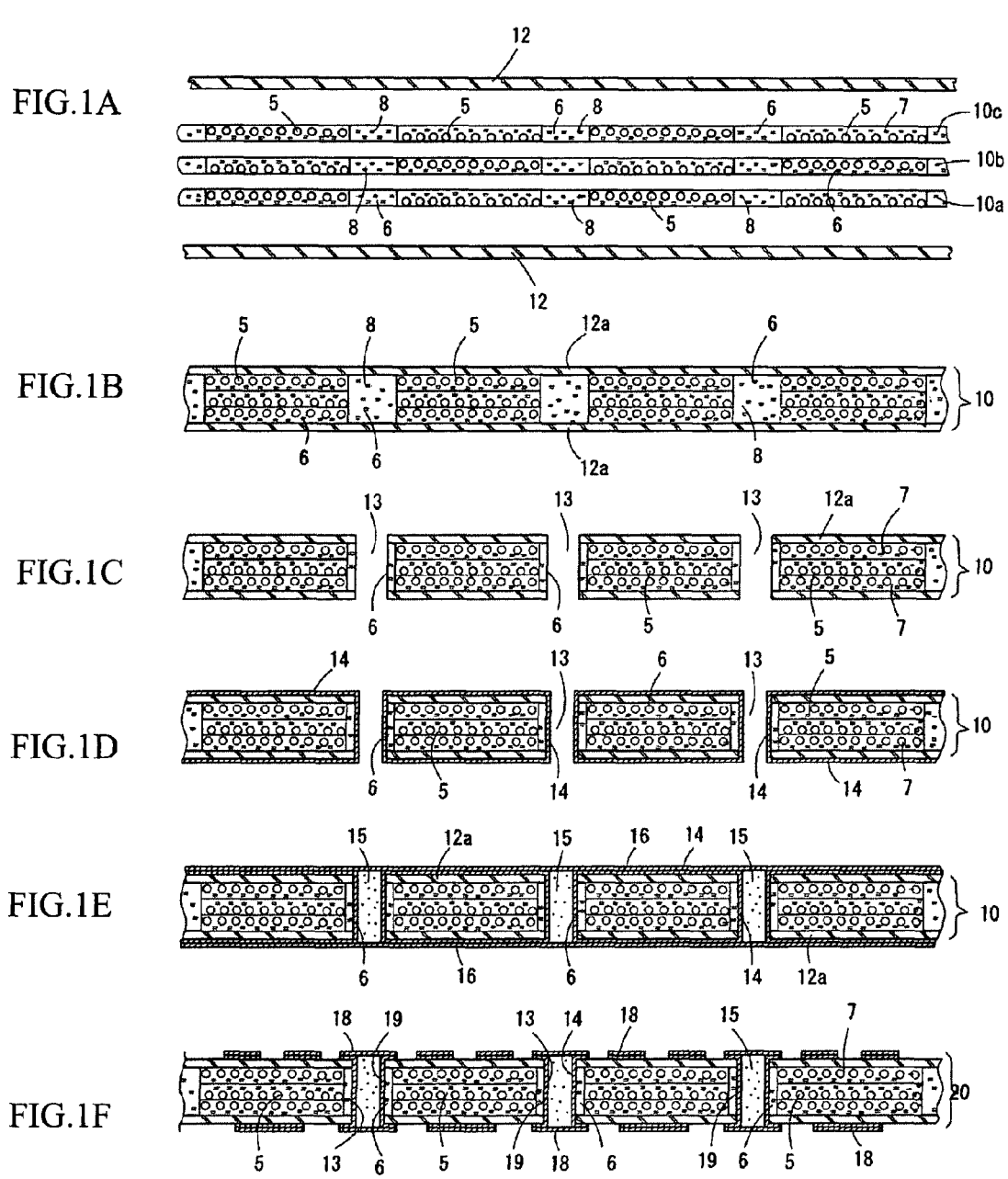
FIGS. 1A to 1F are cross-sectional views showing manufacturing steps of a core substrate.

FIG. 1A shows a state where prepregs 10a, 10b, and 10c that include carbon fiber and electrically insulating prepregs 12 that include a filler such as alumina or silica to adjust the thermal expansion coefficient have been positioned relative to one another in readiness for thermocompression bonding.

Although three prepregs 10a, 10b, and 10c are placed on top of each other to form the core portion 10 in the present embodiment, the number of prepregs used to construct the core portion 10 may be selected as appropriate according to the desired thickness of the circuit board, core substrate strength, or the like.

The most characteristic feature of this method of manufacturing a circuit board according to the present invention is the construction of the prepregs 10a, 10b, and 10c that include carbon fiber and are used to construct the core portion 10. In more detail, although a normal prepreg that uses a carbon fiber woven material is produced by impregnating the carbon fiber woven material with resin such as epoxy resin, the present embodiment uses a woven material 7 produced as a composite weave where carbon fibers 5 are used as first fibers and nonconductive fibers 6 are used as second fibers.

In particular, in the present embodiment, positions where warp and weft of the nonconductive fibers 6 and not the carbon fibers 5 intersect are set as the positions where the PTH to be formed in the core substrate will pass through.

The expression "the positions where warp and weft of the nonconductive fibers 6 intersect are set as the positions where the PTH will pass through" means that the woven material is formed in advance so that when the PTH are formed in the core substrate, the PTH will pass through regions where warp and weft made up of the nonconductive fibers 6 intersect.

Figure 2:
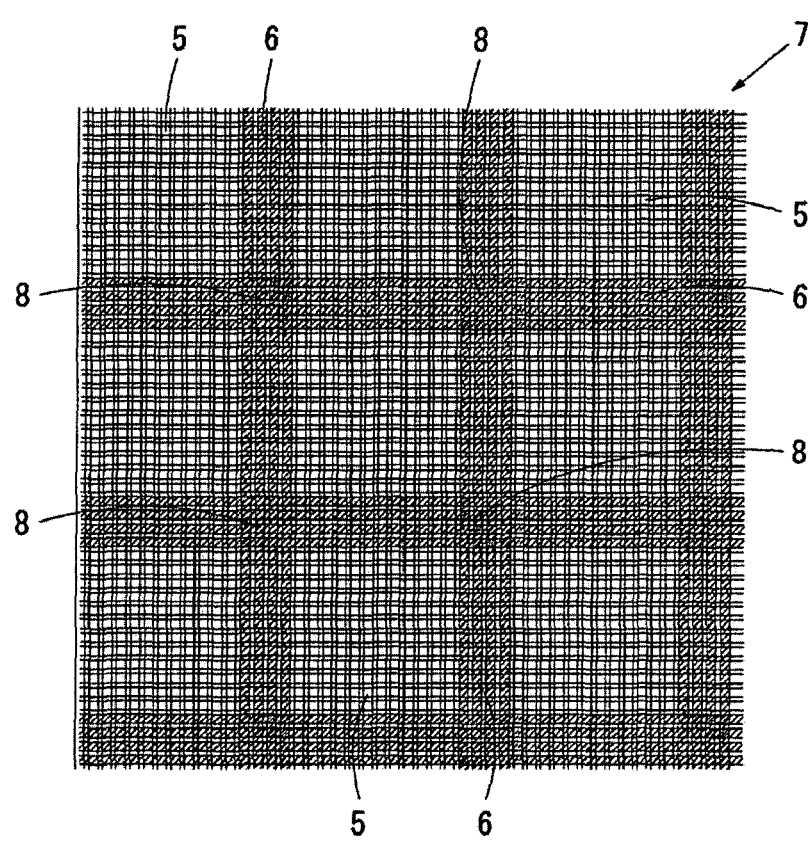
FIG. 2 is a plan view of a woven material that constructs a prepreg.

FIG. 2 shows one example of a woven material 7 used in the prepregs 10a, 10b, and 10c. This woven material 7 is woven by composite weaving warp and weft composed of the carbon fibers 5 and the vertical threads and horizontal threads composed of nonconductive fibers 6.

Figure 3A:
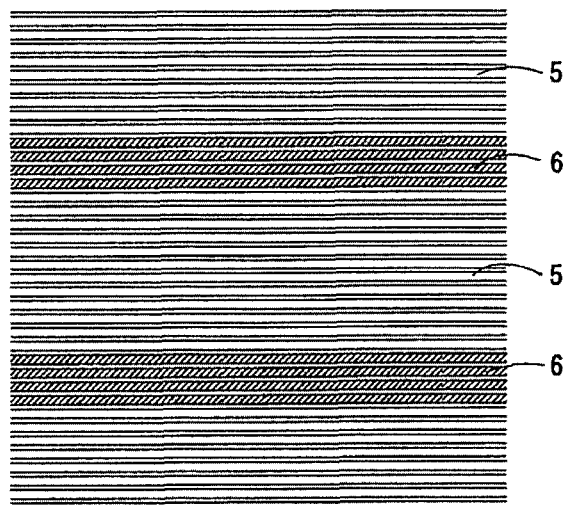
FIGS. 3A and 3B are plan views showing example layouts of the weft and the warp in the woven material.
Figure 3B:
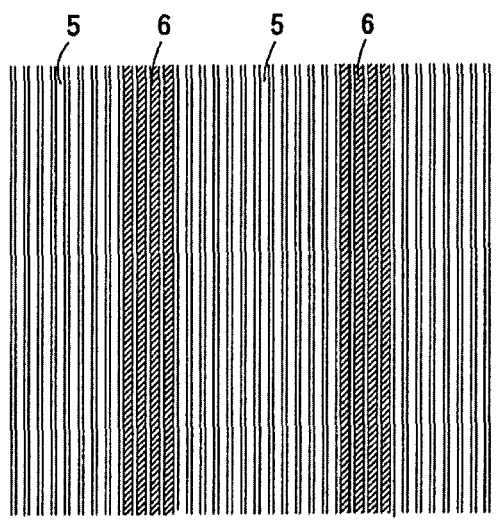

FIG. 3A shows the layout of the weft that constructs the woven material 7 and FIG. 3B shows the layout of the warp. As shown in FIGS. 3A and 3B, in both the weft and the warp, regions where the carbon fibers 5 are disposed and regions where the nonconductive fibers 6 are disposed are alternately disposed at predetermined intervals. By carrying out weaving with the warp and weft disposed in this way, the woven material 7 shown in FIG. 2 is obtained.

In this woven material 7, in the regions 8 where warp and weft composed of the nonconductive fibers 6 intersect, only the nonconductive fibers 6 are present, while in regions aside from the regions 8, there are regions where only the carbon fibers 5 are present and regions where the carbon fibers 5 and the nonconductive fibers 6 are present.

By adjusting the layout positions and disposed number of the nonconductive fibers 6 set in the warp and the weft, it is possible to adjust the positions of the regions where the nonconductive fibers 6 are present in the woven material 7 and the size of the regions 8. The woven material 7 used in the prepregs 10a, 10b, and 10c used in the present embodiment is set in advance so that the PTH to be provided in a core substrate will pass through the regions where the nonconductive fibers 6 intersect.

Single carbon fibers have a diameter of around several μm. Accordingly, it is possible to form a woven material 7 by weaving single carbon fibers and also possible to form the woven material 7 using threads produced by twisting together a plurality of single carbon fibers. Twisted threads of carbon fibers have a diameter of around several tens of μm.

Here, as one example, it is possible to use aramid fibers as the nonconductive fibers 6. Aramid fibers have a thermal expansion coefficient of 2 to 3 ppm/° C. which is lower than that of a semiconductor element, and can be used effectively when producing a core substrate with a low thermal expansion coefficient.

Although the layout pitch of the PTH formed in the core substrate will differ from product to product, in the case where PTH are disposed with a layout pitch of around 400 μm on a typical substrate used to mount a semiconductor element, for example, it is easy to form regions 8 composed of only the nonconductive fibers 6 in accordance with the layout pitch of the PTH.

Although the woven material 7 shown in FIG. 2 is woven so that threads of carbon fibers 5 and the nonconductive fibers 6 are laid out so as to intersect at right angles, it is also possible to weave the warp and the weft so as to intersect at an angle aside from a right angle, such as 60°. Also, although the regions 8 composed of the nonconductive fibers 6 that form the woven material 7 are square in FIG. 2, if the warp and the weft are woven so as to intersect diagonally, the regions 8 will be diamond-shaped. Various methods can be used to weave the woven material 7 and there are no particular limitations on the method of weaving the woven material 7 used in the core portion of the core substrate.

Normally, since the PTH to be formed in the core substrate are disposed so as to be aligned at predetermined intervals in the vertical and horizontal directions, by setting the regions 8 where only the nonconductive fibers 6 are present in accordance with the disposed intervals of the PTH, it is easy to set the sizes of the regions 8 where only the fibers 6 are present in accordance with the hole diameter of the PTH.

Note that when the PTH provided in the core substrate are not disposed so as to be aligned at predetermined intervals, it would be conceivable to dispose the regions 8 of the nonconductive fibers 6 in accordance with the planar layout of such PTH. The present invention is not limited to a circuit board where the PTH are laid out uniformly and can also be applied to a case where the PTH are laid out nonuniformly.

The woven material 7 is impregnated with resin and dried to a semi-hardened state to obtain a prepreg. FIG. 1A shows a state where the prepregs 10a, 10b, and 10c obtained by impregnating the woven material 7 with resin in this way have been positioned. When a plurality of prepregs are positioned, the prepregs are positioned so that the layout positions of the regions 8 where only the nonconductive fibers 6 are present in the woven material 7 match. During this manufacturing process, large pieces of woven material 7 are prepared, such woven material 7 is impregnated with resin such as epoxy resin to form large prepregs 10a, 10b, and 10c, and such large prepregs 10a, 10b, and 10c are used to form a core substrate. FIGS. 1A to 1F show enlargements of parts of large prepregs 10a, 10b, and 10c that will be cut out into a large number of products.

FIG. 1B shows a state where the prepregs 10a, 10b, 10c, and 12 have been subjected to thermal compression bonding to form a flat plate. The core portion 10 formed by integrating the prepregs 10a, 10b, and 10c is disposed inside insulating layers 12a that are composed of the prepregs 12. The core portion 10 includes regions where the carbon fibers 5 that are the first fibers and the nonconductive fibers 6 that are the second fibers are mixed and the regions 8 where only the nonconductive fibers 6 are present. The regions where the carbon fibers 5 are present are conductive, while the regions 8 where only the nonconductive fibers 6 are present are electrically insulating.

After the core portion 10 has been integrally formed, the through holes 13 are formed so as to match the regions 8 of the core portion 10 where only the nonconductive fibers 6 are present (see FIG. 1C). The through holes 13 are formed so as to pass inside the regions where only the nonconductive fibers 6 are present (the regions where the fibers 6 intersect in FIG. 2).

By doing so, the parts of the nonconductive fibers 6 that were impregnated with the resin become exposed to the inner surfaces of the through holes 13. The through holes 13 are formed by drilling, for example.

FIG. 1D shows a state where electroless copper plating and electro copper plating have been carried out on the core portion 10 to form a conductive layer 14 on the inner surfaces of the through holes 13 and the surface of the core portion 10 to form the PTH. Since the inner surfaces of the through holes 13 are covered with the nonconductive fibers 6 and the resin used to impregnate the fibers 6, even if the inner surfaces of the through holes 13 are covered with the conductive layer 14, there will be no electrical shorting between the conductive layer 14 and the regions of the core portion 10 that include the (electrically conductive) carbon fibers 5.

FIG. 1E shows a state where conductive layers 16 have been formed on both surfaces of the core portion 10 after the through holes 13 have been filled with resin 15. The conductive layers 16 can be formed by plating.

FIG. 1F shows a state where wiring patterns 18 have been formed on both surfaces of the substrate by etching the conductive layers 16 and 14 into predetermined patterns, thereby forming a core substrate 20. The conductive layer 14 formed on the inner surfaces of the through holes 13 forms PTH 19 that electrically connect the wiring patterns formed on both surfaces of the core substrate 20.

The PTH 19 are disposed so as to pass through the through holes 13 formed in the core portion 10 and since the inner surfaces of the through holes 13 are covered with the nonconductive fibers 6 and the resin used to impregnate the nonconductive fibers 6, short circuiting between the PTH 19 and the conductive parts of the core portion 10 is prevented.

In this way, with the method of manufacturing a core substrate according to the present embodiment, by composite weaving the woven material 7 that constructs the core portion 10 from the carbon fibers 5 and the nonconductive fibers 6 such as aramid fibers and setting positions where the fibers 6 intersect as the positions at which the PTH 19 pass through the core substrate 20, it is possible to prevent electrical shorting between the PTH 19 and the carbon fibers 5 that construct the core portion 10 of the core substrate 20.

Also, the through holes 13 that form the PTH 19 are merely provided in the core portion 10 of the core substrate 20, so that unlike a conventional core substrate, there is no need to provide preliminary holes for passing the PTH through the substrate. By doing so, the layout pitch of the PTH 19 formed in the core substrate 20 can be made narrower than on a conventional core substrate and the PTH 19 can be formed with a higher density.

Since the through holes 13 formed in the core portion 10 have a smaller diameter than on a conventional substrate, even if the through holes 13 are filled with the resin 15, compared to the case where preliminary holes are filled with resin as in a conventional substrate, there is a reduction in the amount of resin used to fill the holes, which is effective in suppressing a rise in the thermal expansion coefficient of the core substrate.

Circuit Board

Figure 4:
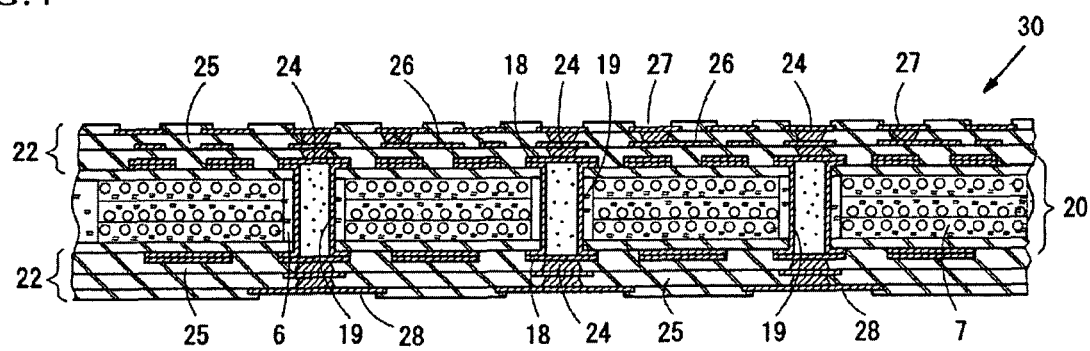
FIG. 4 is a cross-sectional view of a circuit board.

FIG. 4 shows a state where wiring layers 22 have been laminated on both surfaces of the core substrate 20 to form a circuit board 30. The wiring layers 22 are formed so that wiring patterns 26 are electrically connected by via holes 24 with insulating layers 25 in between. The wiring patterns 26 formed on the wiring layers 22 on both surfaces of the circuit board 30 are electrically connected via the PTH 19 formed in the core substrate 20.

The wiring layers 22 can be formed by a method such as building up. Pads 27 for connecting a semiconductor element are formed on a surface of the circuit board 30 onto which a semiconductor element is to be mounted. Lands 28 to which external connection terminals such as solder balls are bonded are formed on the other surface of the circuit board 30.

Figure 5:
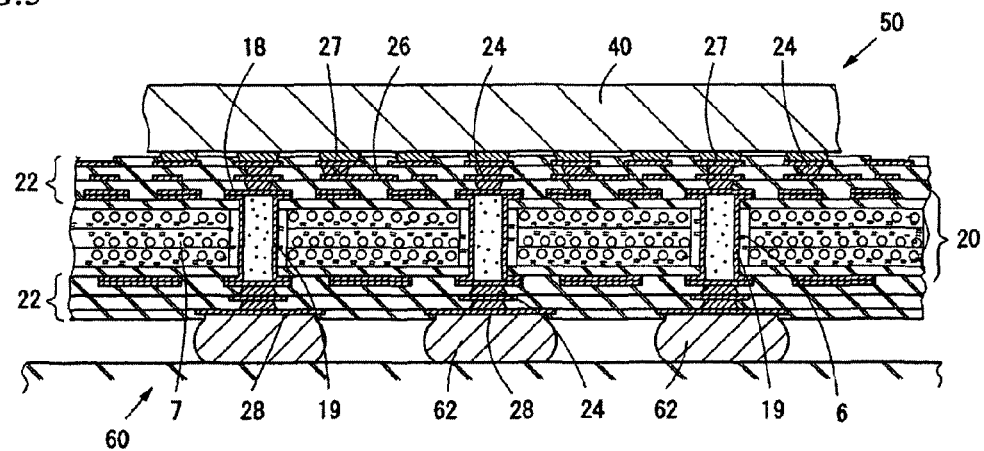
FIG. 5 is a cross-sectional view of a semiconductor device.

FIG. 5 shows a state where a semiconductor device 50, which is constructed by mounting a semiconductor element 40 on the circuit board 30, has been mounted on a mounting substrate 60. The semiconductor element 40 is provided on the circuit board 30 by flip-chip bonding. The semiconductor device 50 is mounted on the mounting substrate 60 by joining solder balls 62 to the lands 28.

The semiconductor element 40 and the mounting substrate 60 are electrically connected via the PTH 19 formed in the circuit board 30, the wiring patterns 18, 26 formed on the wiring layers 22, the via holes 24, and the like.

As described earlier, since the PTH 19 formed in the circuit board 30 are formed after providing the through holes 13 for forming the PTH 19 in the core substrate 20, the PTH 19 can be disposed with a fine pitch of 400 μm, for example, which is suited to mounting a semiconductor element where the electrodes are disposed at a fine pitch.

According to the circuit board 30 and the semiconductor device 50 according to the present embodiment, by using the woven material 7 that includes the carbon fibers 5 with a low thermal expansion coefficient in the core substrate 20, it is possible to match the thermal expansion coefficient of the circuit board 30 with the thermal expansion coefficient of the semiconductor element 40. The thermal expansion coefficient of carbon fibers is 0 to 1 ppm/° C. Accordingly, by adjusting the relative proportions of the carbon fibers 5 and the nonconductive fibers 6, adjusting the filler mixed into the woven material 7 and the like, it is possible to make the overall thermal expansion coefficient of the circuit board 30 match the thermal expansion coefficient of a semiconductor element.

Note that although an example where the semiconductor device 50, which is produced by mounting the semiconductor element 40 on the circuit board 30, is mounted on the mounting substrate 60 has been described in the above embodiment, it is also possible to use a construction where a semiconductor device, which is constructed with the semiconductor element 40 provided on another circuit board with the circuit board 30 in between as an interposer, is mounted on the mounting substrate 60.

Figure 6:
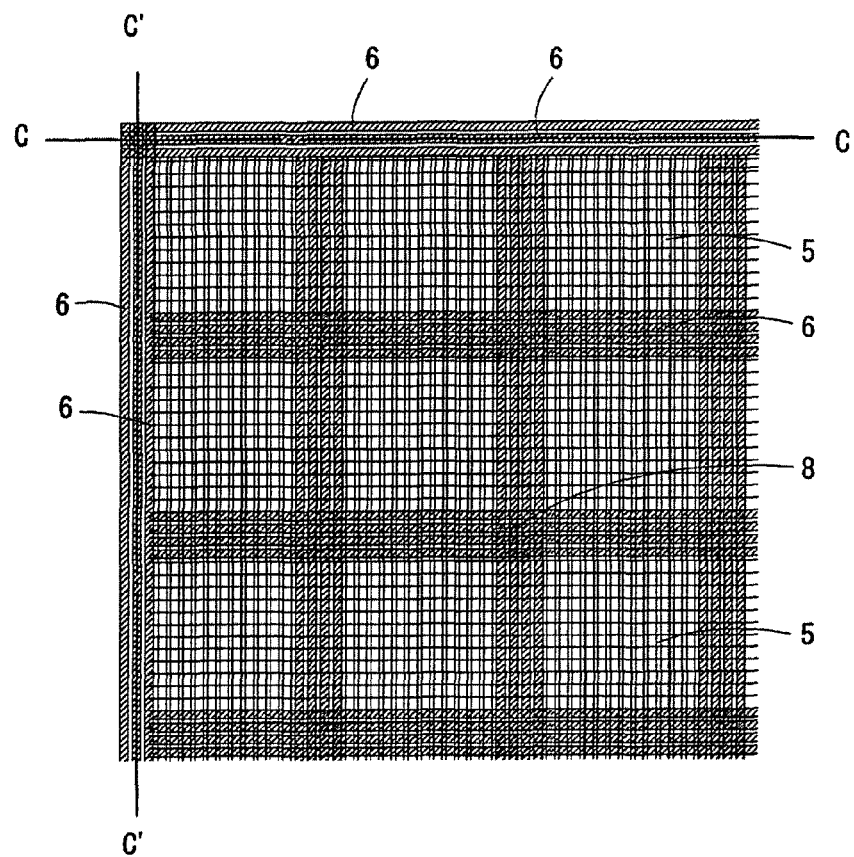
FIG. 6 is a plan view of another example of a woven material that constructs a core portion.

FIG. 6 shows an example where during the composite weaving of the carbon fibers 5 and the nonconductive fibers 6, the nonconductive fibers 6 are woven in accordance with positions where the individual circuit boards will finally be cut out. In FIG. 6, the line C-C and line C'-C' show cutting positions for the circuit boards. In this way, when only the nonconductive fibers 6 are disposed at positions where individual circuit boards are cut out from the circuit board, the individual package circuit boards obtained from the large circuit board will be obtained with the nonconductive fibers 6 exposed to the outer side surfaces. Since the carbon fibers 5 are not exposed to the outer side surfaces of the package circuit boards, it is possible to avoid having the carbon fibers 5 become detached from the outer side surfaces of the package circuit boards. Also, since the carbon fibers 5 are not exposed to the outer side surfaces of the package circuit boards, it is possible to avoid contact between the package circuit boards and other electronic components which would cause shorting. There is also favorable sealing of the outer side surfaces of the package circuit boards by the resin impregnated in the nonconductive fibers 6, which makes it possible to avoid moisture penetration into the package circuit boards.

The circuit board 30 according to the present embodiment uses the woven material 7 constructed of a composite of the carbon fibers 5 and the nonconductive fibers 6 as the core substrate 20. A variety of characteristics are demanded for the core substrate 20 that constructs the circuit board 30. As described earlier, one of such demands is to reduce the thermal expansion coefficient of the core substrate 20 to reduce the thermal stress that occurs between a semiconductor element and the circuit board when the semiconductor element is mounted. Other demanded characteristics include thinly forming the circuit board 30, achieving a predetermined strength, and high-speed processing to achieve high-frequency data transfer.

With the circuit board according to the present invention, by constructing the prepregs that construct the core substrate by using carbon fibers as the first fibers and nonconductive fibers as the second fibers, it is possible to provide a circuit board with predetermined characteristics that depend on the combination of first fibers and second fibers.

Although aramid fibers are used as the second fibers in the present embodiment described above, it is also possible to use liquid crystal polymer fibers such as polyester, cellulose microfibril fibers, glass fibers, or in particular silica glass fibers, syndiotactic polymer, or the like.

According to the method of constructing a prepreg using the first fibers that are conductive and the second fibers that are non-conductive, problems where the core portion is conductive due to the core portion being formed using a prepreg that is entirely conductive (such as a carbon fiber woven material), and resulting structural complexity, such as where the core portion and the wiring layer are insulated from one another by electrically insulating the PTH from the core portion, can be avoided, which means it is possible to thinly form the circuit board.

Note that as the fibers that construct the prepregs, the present invention is not limited to two types of fibers, that is, the first and second fibers, and it is also possible to use a combination of three or more types of fibers. It is also possible to use a non-woven material in place of the woven material used in the prepregs that construct the core portion in the embodiment described above. It is also possible to add filler to the prepregs.

What is claimed is:

1. A method of manufacturing a circuit board, comprising:
   a step of forming a core portion by thermal compression bonding prepregs which include first fibers that conduct electricity and second fibers that do not conduct electricity, which have the second fibers disposed at positions where plated through holes will pass through, and which are impregnated with resin;
   a step of forming through holes at positions in the core portion where the second fibers are disposed; and
   a step of forming a conductive layer on inner surfaces of the through holes to form plated through holes at positions that do not interfere with the first fibers and thereby produce a core substrate.

2. A method of manufacturing a circuit board according to claim 1,
   further comprising a step of laminating wiring layers on both surfaces of the core substrate.

3. A method of manufacturing a circuit board according to claim 1,
   wherein in the step of forming the core portion, a plurality of prepregs are subjected to thermal compression bonding with positions where the second fibers are disposed and where the plated through holes will pass through aligned relative to one another.

4. A method of manufacturing a circuit board according to claim 1,
   wherein the first fibers are carbon fibers.

5. A method of manufacturing a circuit board according to claim 1,
   wherein the second fibers are aramid fibers.

* * * * *